(12) United States Patent
Sun

(10) Patent No.: US 11,183,551 B2
(45) Date of Patent: Nov. 23, 2021

(54) DISPLAY PANEL HAVING AN ELECTROMAGNETIC SHIELDING STRUCTURE

(71) Applicant: WUHAN CHINA STAR OPTOELECTRONICS SEMICONDUCTOR DISPLAY TECHNOLOGY CO., LTD., Wuhan (CN)

(72) Inventor: Jiajia Sun, Wuhan (CN)

( * ) Notice: Subject to any disclaimer, the term of this patent is extended or adjusted under 35 U.S.C. 154(b) by 0 days.

(21) Appl. No.: 16/641,657

(22) PCT Filed: Nov. 19, 2019

(86) PCT No.: PCT/CN2019/119319
§ 371 (c)(1),
(2) Date: Feb. 25, 2020

(87) PCT Pub. No.: WO2021/027170
PCT Pub. Date: Feb. 18, 2021

(65) Prior Publication Data
US 2021/0036084 A1    Feb. 4, 2021

(30) Foreign Application Priority Data

Aug. 15, 2019   (CN) .......................... 201910753701.5

(51) Int. Cl.
| H01L 27/32 | (2006.01) |
| H01L 27/14 | (2006.01) |
| H01L 51/52 | (2006.01) |
| H05K 9/00 | (2006.01) |
| H01L 27/146 | (2006.01) |

(52) U.S. Cl.
CPC ........ H01L 27/3272 (2013.01); H01L 27/323 (2013.01); H01L 51/5253 (2013.01); H05K 9/0081 (2013.01); *H01L 27/14678* (2013.01); *H01L 2251/301* (2013.01)

(58) Field of Classification Search
CPC .............. H01L 27/3272; H01L 27/323; H01L 51/5253; H01L 27/14678; H01L 2251/301
See application file for complete search history.

(56) References Cited

U.S. PATENT DOCUMENTS

| 8,253,692 | B2* | 8/2012 | Lai ........................ H01L 27/323 345/173 |
| 9,983,342 | B2* | 5/2018 | Schlaupitz ........... G02B 6/0065 |
| 10,000,407 | B2* | 6/2018 | Tian ...................... E06B 3/6612 |
| 10,712,600 | B1* | 7/2020 | Liau .................. G02F 1/133308 |
| 10,936,128 | B2* | 3/2021 | Kawaguchi ............. G06F 3/047 |
| 2013/0154961 | A1* | 6/2013 | Wu ........................ G06F 3/041 345/173 |
| 2018/0166507 | A1 | 6/2018 | Hwang et al. |
| 2018/0268187 | A1* | 9/2018 | Jeong .................... G06K 9/0002 |
| 2018/0366679 | A1* | 12/2018 | Kim ....................... B32B 27/365 |
| 2019/0019855 | A1* | 1/2019 | Park ....................... H05K 1/117 |

FOREIGN PATENT DOCUMENTS

| CN | 201374047 Y | 12/2009 |
| CN | 108227978 A | 6/2018 |
| CN | 108493351 A | 9/2018 |

* cited by examiner

*Primary Examiner* — Ida M Soward

(57) ABSTRACT

The present application discloses a display panel, including an electromagnetic shielding structure; an array layer disposed inside the electromagnetic shielding structure; and a touch layer disposed outside the electromagnetic shielding structure and positioned on one side of the electromagnetic shielding structure.

9 Claims, 4 Drawing Sheets

DISPLAY PANEL HAVING AN ELECTROMAGNETIC SHIELDING STRUCTURE

CROSS REFERENCE TO RELATED APPLICATION

The present application claims priority of a Chinese patent application filed with the National Intellectual Property Administration on Aug. 15, 2019, application No. 201910753701.5, titled "Display panel", which is incorporated by reference in the present application in its entirety.

FIELD OF INVENTION

The present application relates to the technical field of display panels, and in particular, to a display panel.

BACKGROUND OF INVENTION

Compared with traditional liquid crystal display (LCD), organic light-emitting diode (OLED) devices have advantages of light weight, wide viewing angles, fast response times, low-temperature resistance, high luminous efficiency, etc. Therefore, OLED devices have been regarded as next-generation new display technology in the display panel industry. In particular, OLED can be made into curved flexible display screen on flexible substrate, which is a huge advantage of OLED display panels.

In the prior art, a structure of an OLED device can roughly be divided into a flexible substrate, an array layer, a light-emitting (EL) layer, a thin-film encapsulation (TFE) layer, and a touch layer, wherein the TFE layer can be further divided into a first inorganic layer, an organic layer, and a second inorganic layer. In order to realize bendability of the OLED device, a thickness reduction of OLED panel has become a focus of research in the field. Since a thickness of the TFE layer is the thickest (greater than 14 microns) in the OLED panel, reducing the thickness of the entire OLED panel by thinning the TFE layer has become the focus of current research.

However, because a layer above the TFE layer is a touch layer and a layer below the TFE layer is an array layer, both of the layers contain circuits inside. When the TFE film layer is thinned to a certain degree, that is, when a distance between the touch layer and the array layer is too short, the circuits in the array layer will be disturbed by electrodes in the touch layer due to a charge induction between the circuits, thereby resulting in display abnormality.

Technical Problem

An embodiment of the present application provides a display panel to solve the display abnormality problem caused by an excessively short distance between a touch layer and an array layer in the display panel.

SUMMARY OF INVENTION

An embodiment of the present application further provides a display panel, including:
an electromagnetic shielding structure; an array layer disposed inside the electromagnetic shielding structure; and a touch layer disposed outside the electromagnetic shielding structure and positioned on one side of the electromagnetic shielding structure.

Further, the display panel further includes a light-emitting layer; the light-emitting layer is disposed in the electromagnetic shielding structure and is positioned on a side of the array layer close to the touch layer.

Further, the display panel further includes a light-emitting layer; the light-emitting layer is disposed in the electromagnetic shielding structure and is positioned on a side of the array layer close to the touch layer.

Further, the display panel further includes a thin film encapsulation layer, and the thin film encapsulation layer includes a first inorganic layer, an organic layer, and a second inorganic layer.

The first inorganic layer is disposed in the electromagnetic shielding structure and covers the light-emitting layer; the organic layer and the second inorganic layer are disposed outside the electromagnetic shielding structure, and the organic layer is positioned between the electromagnetic shielding structure and the touch layer, and the second inorganic layer covers the organic layer and the electromagnetic shielding structure.

Further, the display panel further includes a barrier layer; the barrier layer is disposed outside the electromagnetic shielding structure and is positioned on a side of the electromagnetic shielding structure away from the touch layer.

Further, the display panel further includes a base substrate; the base substrate is disposed on a side of the barrier layer away from the electromagnetic shielding structure.

Further, the electromagnetic shielding structure includes a first conductive layer and a second conductive layer; the second conductive layer extends to a periphery of the first conductive layer to connect with the first conductive layer to enclose an accommodation space, and the array layer is disposed in the accommodation space.

Further, materials of the first conductive layer and the second conductive layer are the same, and the materials comprise aluminum, silver, copper, magnesium, and a metal alloy or indium tin oxide (ITO).

Further, the electromagnetic shielding structure is a hollow mesh structure.

Further, a mesh of the hollow mesh structure is square, rectangular or rhombic.

Beneficial Effect

The beneficial effect of the present application is: an electromagnetic shielding structure is provided; an array layer is disposed inside the electromagnetic shielding structure, and a touch layer is disposed outside the electromagnetic shielding structure, such that external electromagnetic wave signal interference can be effectively shielded by the electromagnetic shielding structure. Therefore, after a distance between the array layer and the touch layer is reduced, circuits in the array layer will not be interfered with by the electromagnetic wave signals of circuits in the touch layer, thereby ensuring normal display of the display panel.

DESCRIPTION OF DRAWINGS

The specific implementation of the present application will be described in detail below with reference to the drawings to make the technical solution and other beneficial effects of the present application obvious.

DETAILED DESCRIPTION OF PREFERRED EMBODIMENTS

The specific structural and functional details disclosed herein are merely representative and are for the purpose of describing exemplary embodiments of the present application. However, the present application may be embodied in many alternate forms and should not be construed as being limited to only the embodiments set forth herein.

In the description of the present application, it should be understood that an orientation or a positional relationship indicated by the terms "center", "horizontal", "above", "below", "left", "right", "vertical", "horizontal", "top", "bottom", "inside", "outside", etc. is only for the convenience of describing the present application and simplifying the description, and does not indicate or imply that the device or element referred to must have a specific orientation, be constructed and operate in a specific orientation, and therefore cannot be understood as a limitation on the present application. In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present application, unless otherwise stated, "a plurality" means two or more. Moreover, the term "including" and any synonyms thereof are intended to cover a non-exclusive inclusion.

In the description of the present application, it should be noted that the terms "installation", "connected to each other", and "connected" should be interpreted in a broad sense unless otherwise specified and limited. For example, it can be a fixed connection, a detachable connection, or an integral connection; it can be a mechanical connection or an electrical connection; it can be directly connected or indirectly connected by an intermediate medium, and it can be an internal connection of two elements. For those of ordinary skill in the art, the specific meanings of the above terms in the present application can be understood in specific situations.

The terms used herein are for the purpose of describing particular embodiments only and is not intended to limit the exemplary embodiments. Unless the context clearly indicates otherwise, the singular forms "a" and "an" are intended to include the plural. It should also be understood that the terms "including" and/or "comprising" as used herein specify the existence of stated features, integers, steps, operations, units and/or components. It does not exclude the presence or addition of one or more other features, integers, steps, operations, units, components, and/or combinations thereof.

The application is further described below with reference to the figures and embodiments.

Figure 1:
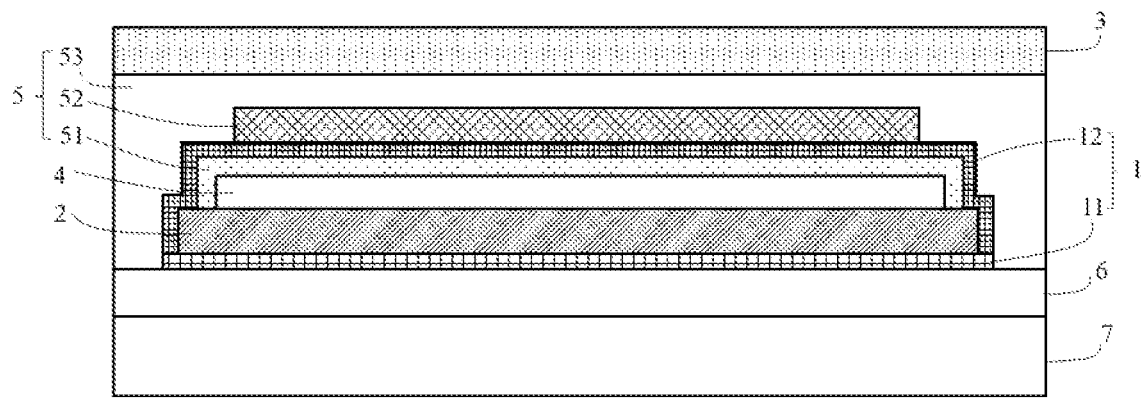
FIG. 1 is a schematic structural diagram of a display panel according to an embodiment of the present application.

As shown in FIG. 1, an embodiment of the present application provides a display panel including an electromagnetic shielding structure 1, an array layer 2, and a touch layer 3. Wherein, the array layer 2 is disposed inside the electromagnetic shielding structure 1, that is, the electromagnetic shielding structure 1 is disposed to package the array layer 2, the touch layer 3 is disposed outside the electromagnetic shielding structure 1, the touch layer 3 is positioned on one side of the electromagnetic shielding structure 1, and the touch layer 3 is disposed in parallel with the array layer 2.

Figure 2:
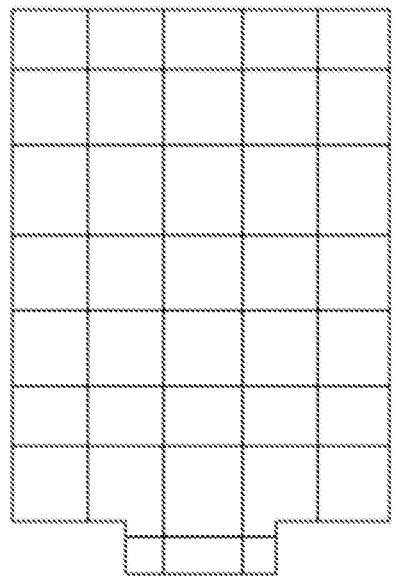
FIG. 2 is a first plan view of an electromagnetic shielding structure in a display panel according to an embodiment of the present application.
Figure 3:
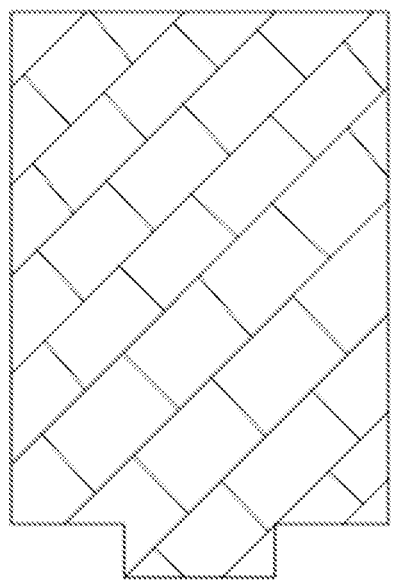
FIG. 3 is a second plan view of an electromagnetic shielding structure in a display panel according to an embodiment of the present application.
Figure 4:
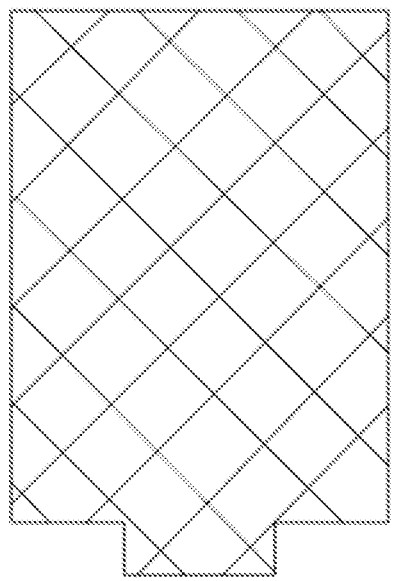
FIG. 4 is a third plan view of an electromagnetic shielding structure in a display panel according to an embodiment of the present application.

The electromagnetic shielding structure 1 can be a hollow structure, specifically a hollow mesh structure, so that the electromagnetic shielding structure 1 forms a closed electromagnetic shielding network. The closed electromagnetic shielding network consists of multiple meshes. As shown in FIG. 2 to FIG. 4, the meshes are square, rectangular, or rhombic, and the meshes can also have other shapes, which are not specifically limited herein.

The array layer 2 includes a TFT transistor and a driving circuit, and the touch layer 3 includes a sensing electrode.

In order to reduce a thickness of OLED, a distance between the array layer 2 and the touch layer 3 needs to be reduced. However, when the distance between the array layer 2 and the touch layer 3 is too short, circuits in the array layer 2 will be interfered by electromagnetic signals of electrodes in the touch layer 3. Therefore, the electromagnetic shielding structure 1 is provided around the array layer 2 to shield the electromagnetic signals outside the electromagnetic shielding structure 1, such that the array layer 2 in the electromagnetic shielding structure 1 will not be interfered by the electromagnetic wave signals from the electrodes of the touch layer 3. Thereby, the distance between the array layer 2 and the touch layer 3 can be reduced, and normal display of a display panel can be guaranteed.

Further, as shown in FIG. 1, the display panel further includes a light-emitting layer 4; the light-emitting layer 4 is disposed in the electromagnetic shielding structure 1 and is positioned on a side of the array layer 2 close to the touch layer 3.

In the present embodiment, the array layer 2 transmits a control signal to the light-emitting layer 4 to control the light-emitting layer 4 to emit light. The light-emitting layer 4 and the array layer 2 are together disposed in the electromagnetic shielding structure 1 to ensure that signals transmitted between the light-emitting layer 4 and the array layer 2 are not interfered by the electromagnetic signals of the electrodes in the touch layer 3.

Further, as shown in FIG. 1, the display panel further includes a thin film encapsulation layer 5. The thin film encapsulation layer 5 includes a first inorganic layer 51, an organic layer 52, and a second inorganic layer 53. The first inorganic layer 51 is disposed inside the electromagnetic shielding structure 1 and covers the light-emitting layer 4. The organic layer 52 and the second inorganic layer 53 are disposed outside the electromagnetic shielding structure 1, the organic layer 52 is positioned between the electromagnetic shielding structure 1 and the touch layer 3, and the second inorganic layer 53 covers the organic layer 52 and the electromagnetic shielding structure 1.

The first inorganic layer 51 needs to cover the light-emitting layer 4 to prevent water and oxygen from entering the light-emitting layer 4. Therefore, the first inorganic layer 51 is disposed inside the electromagnetic shielding structure 1. The organic layer 52 and the second inorganic layer 53 can be disposed outside the electromagnetic shielding structure 1; specifically, the organic layer 52 is disposed on the electromagnetic shielding structure 1, and the second inorganic layer 53 is disposed on the electromagnetic shielding structure 1 and the organic layer 52 to further encapsulate the electromagnetic shielding structure 1 and the light-emitting layer 4 in the electromagnetic shielding structure 1.

Further, as shown in FIG. 1, the display panel further includes a barrier layer 6; the barrier layer 6 is provided outside the electromagnetic shielding structure 1 and is positioned on a side of the electromagnetic shielding structure 1 away from the touch layer 3.

In the present embodiment, the electromagnetic shielding structure 1 is disposed on the barrier layer 6, and the barrier layer 6 is an inorganic layer having a function of blocking water and oxygen, and is combined with the encapsulation layer 5 to protect the light-emitting layer 4 in the electromagnetic shielding structure 1.

Further, as shown in FIG. 1, the display panel further includes a base substrate 7; the base substrate 7 is disposed on a side of the barrier layer 6 away from the electromagnetic shielding structure 1.

In the present embodiment, the barrier layer 6 is disposed on the base substrate 7; the substrate 7 can be a flexible substrate.

Specifically, the electromagnetic shielding structure 1 includes a first conductive layer 11 and a second conductive layer 12; the second conductive layer 12 extends to a periphery of the first conductive layer 11 so as to connect with the first conductive layer 11 to enclose an accommodation space, and the array layer is disposed inside the accommodation space.

In the present embodiment, the first conductive layer 11 and the second conductive layer 12 are disposed opposite to each other, the second conductive layer 12 extends toward the first conductive layer 11 and extends to an edge around the first conductive layer 11 to form an enclosed structure with the first conductive layer 11, and the enclosed structure has the accommodation space for disposing the array layer 2, the light-emitting layer 4, and the first inorganic layer 51.

Specifically, the first conductive layer 11 and the second conductive layer 12 are both hollow mesh structures, and the hollow mesh structures consist of a plurality of meshes. As shown in FIG. 2 to FIG. 4, the meshes are square, rectangular, or rhombic, and the meshes can also have other shapes, which are not specifically limited herein. In addition, a material of the first conductive layer 11 and the second conductive layer 12 are same, and the material can be metal, including but not limited to a single metal, such as aluminum (Al), silver (Ag), copper (Cu), or magnesium (Mg), or a metal alloy. It can also be other conductive materials, such as indium tin oxide (ITO).

In the embodiment of the present application, the electromagnetic shielding structure is provided; the array layer is disposed inside the electromagnetic shielding structure, and the touch layer is disposed outside the electromagnetic shielding structure, such that external electromagnetic wave signal interference can be effectively shielded by the electromagnetic shielding structure. Therefore, after the distance between the array layer and the touch layer is reduced, the circuits in the array layer will not be interfered with by the electromagnetic signals of the circuits in the touch layer, thereby ensuring normal display of the display panel.

Figure 5:
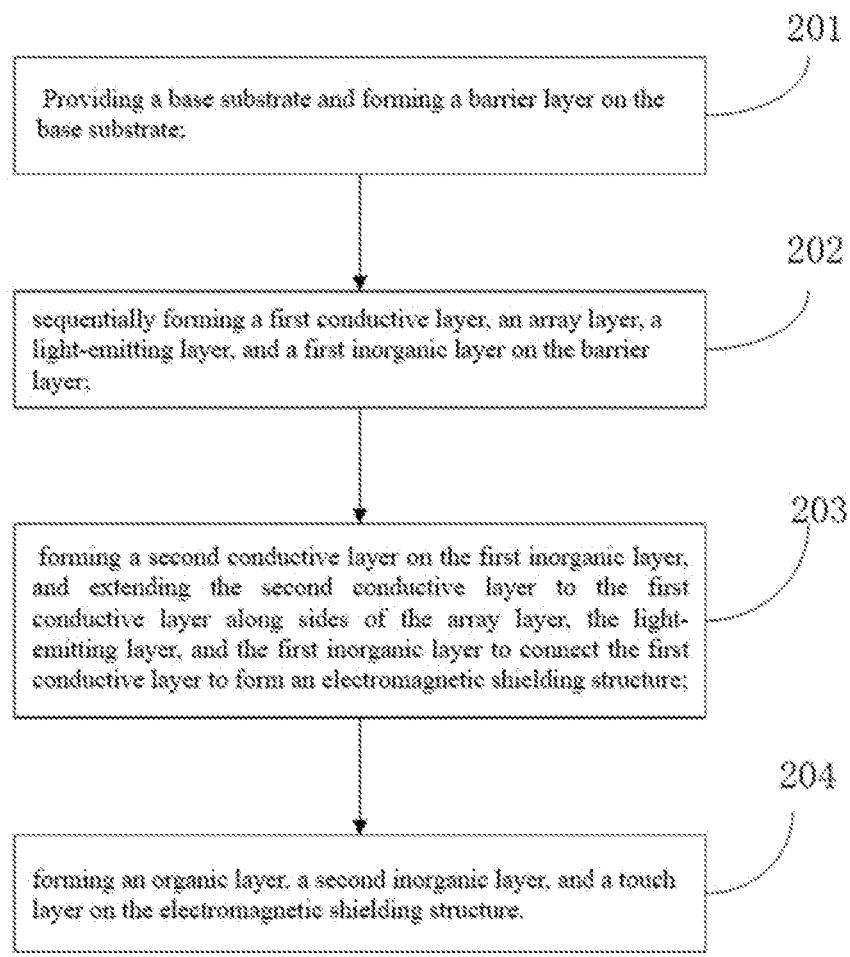
FIG. 5 is a schematic flowchart of a method of manufacturing a display panel according to an embodiment of the present application.

As shown in FIG. 5, an embodiment of the present application further provides a method of manufacturing a display panel, including:

201, providing a base substrate and forming a barrier layer on the base substrate.

Figure 6:
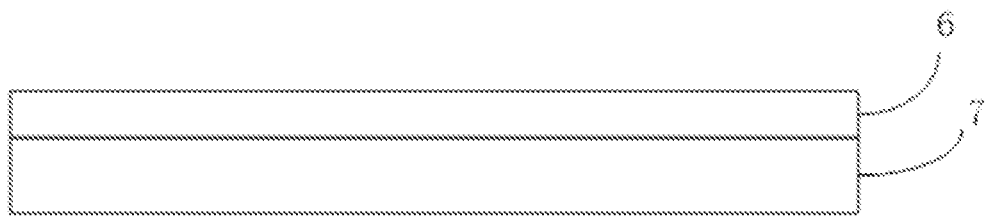
FIG. 6 is a schematic structural diagram of step 201 in a method of manufacturing a display panel according to an embodiment of the present application.

In the embodiment, as shown in FIG. 6, the base substrate 7 is a flexible substrate. A barrier layer 6 is formed on the flexible substrate 7, and the barrier layer 6 is an inorganic layer 6 having a function of blocking water and oxygen.

202, sequentially forming a first conductive layer, an array layer, a light-emitting layer, and a first inorganic layer on the barrier layer.

Figure 7:
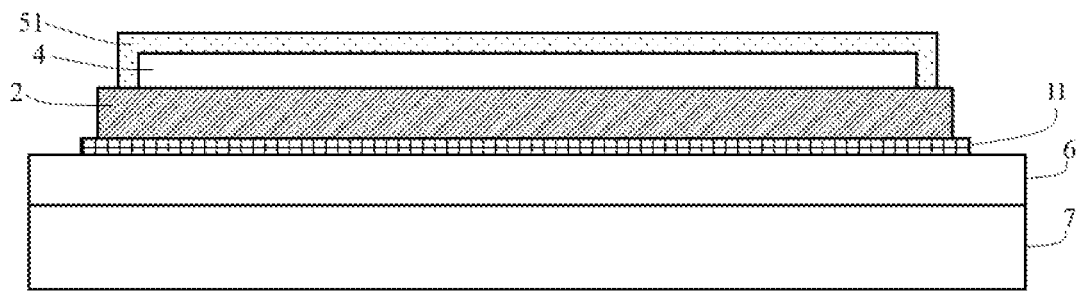
FIG. 7 is a schematic structural diagram of step 202 in a method of manufacturing a display panel according to an embodiment of the present application.

In the embodiment, as shown in FIG. 7, a first conductive layer 11 is formed on the barrier layer 6, and the first conductive layer 11 is treated by etching or the like to form a hollow mesh structure. The hollow mesh structure consists of a plurality of meshes, and the meshes are square, rectangular, or rhombic. A material of the first conductive layer 11 can be metal, including but not limited to a single metal, such as aluminum (Al), silver (Ag), copper (Cu), or magnesium (Mg), or a metal alloy. It can also be other conductive materials, such as indium tin oxide (ITO).

An array layer 2 is formed on the first conductive layer 11, a light-emitting layer 4 is formed on the array layer 2, and a first inorganic layer 51 is formed on the light-emitting layer 4. The array layer 2 includes a thin film transistor (TFT) and a driving circuit for controlling the light-emitting layer 4. The first inorganic layer 51 needs to cover the light-emitting layer 4 to prevent water and oxygen from entering the light-emitting layer 4.

203, forming a second conductive layer on the first inorganic layer, and extending the second conductive layer to the first conductive layer along sides of the array layer, the light-emitting layer, and the first inorganic layer to connect the first conductive layer to form an electromagnetic shielding structure.

Figure 8:
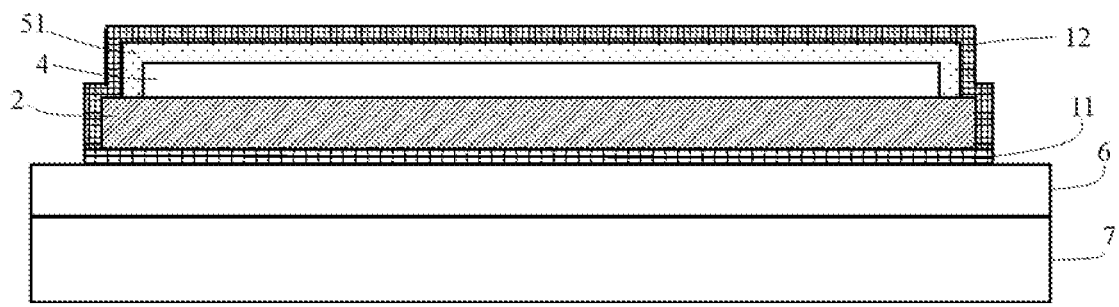
FIG. 8 is a schematic structural diagram of step 203 in a method of manufacturing a display panel according to an embodiment of the present application.

In the embodiment, as shown in FIG. 8, a second conductive layer 12 is formed on the first inorganic layer 51. With a mask opening design, the second conductive layer 12 and surroundings of the first conductive layer 11 are connected to each other, and a hollow mesh structure is formed on a surface of the second conductive layer 12 and an overlap of sides of the first conductive layer 11 and the second conductive layer 12 by a technique such as etching. The manufacturing process and materials of the second conductive layer 12 and the first conductive layer 11 are same. An electromagnetic shielding structure 1 is formed by the first conductive layer 11 and the second conductive layer 12, and the array layer 2 is disposed inside the electromagnetic shielding structure 1 to ensure that the array layer 2 is not interfered by external electromagnetic signals.

204, forming an organic layer, a second inorganic layer, and a touch layer on the electromagnetic shielding structure 1. In the embodiment, as shown in FIG. 1, an organic layer 52 is formed on the second conductive layer 12 in the electromagnetic shielding structure 1, a second inorganic layer 53 is formed on the organic layer 52 and the electromagnetic shielding structure 1, and a touch layer 3 is formed on the second inorganic layer 53. The first inorganic layer 51, the organic layer 52, and the second inorganic layer 53 constitute an encapsulation layer 5, which can be thinned. The touch layer 3 is disposed outside the electromagnetic shielding structure 1 so that the array layer 2 inside the electromagnetic shielding structure 1 will not be interfered by the electromagnetic signals from the electrodes of the touch layer 3, ensuring the normal display of the display panel. Moreover, the manufacturing method is simple and has strong feasibility.

As stated above, although the present application has already been described in the embodiments, the present application is not limited to the disclosed embodiments. It is obvious to those skilled in the art that the above exemplary embodiments may be modified without departing from the scope and spirit of the present application. Therefore, the protection scope of the present application is subject to the scope defined by the claims.

What is claimed is:

1. A display panel, comprising:
   an electromagnetic shielding structure;
   an array layer disposed inside the electromagnetic shielding structure; and
   a touch layer disposed outside the electromagnetic shielding structure and positioned on one side of the electromagnetic shielding structure.

2. The display panel according to claim 1, further comprising a light-emitting layer; wherein the light-emitting layer is disposed inside the electromagnetic shielding structure and is positioned on a side of the array layer close to the touch layer.

3. The display panel according to claim 2, further comprising a thin-film encapsulation layer, wherein the thin-film encapsulation layer comprises a first inorganic layer, an organic layer, and a second inorganic layer;
   the first inorganic layer is disposed inside the electromagnetic shielding structure and covers the light-emitting layer, the organic layer and the second inorganic layer are disposed outside the electromagnetic shielding structure, the organic layer is positioned between the electromagnetic shielding structure and the touch layer, and the second inorganic layer covers the organic layer and the electromagnetic shielding structure.

4. The display panel according to claim 1, further comprising a barrier layer;
   wherein the barrier layer is disposed outside the electromagnetic shielding structure and is positioned on a side of the electromagnetic shielding structure away from the touch layer.

5. The display panel according to claim 4, further comprising a base substrate;
   wherein the base substrate is disposed on a side of the barrier layer away from the electromagnetic shielding structure.

6. The display panel according to claim 1, wherein the electromagnetic shielding structure comprises a first conductive layer and a second conductive layer;
   the second conductive layer extends to a periphery of the first conductive layer to connect with the first conductive layer to enclose an accommodation space, and the array layer is disposed in the accommodation space.

7. The display panel according to claim 6, wherein materials of the first conductive layer and the second conductive layer are same, and the materials comprise aluminum, silver, copper, magnesium, a metal alloy, or indium tin oxide.

8. The display panel according to claim 1, wherein the electromagnetic shielding structure is a hollow mesh structure.

9. The display panel according to claim 8, wherein a mesh of the hollow mesh structure is square, rectangular, or rhombic.

* * * * *